United States Patent [19]

Lerner

[11] 4,005,361

[45] Jan. 25, 1977

[54] PERFORMANCE ASSURANCE APPARATUS FOR PHASED ANTENNA ARRAY DRIVES

[75] Inventor: David S. Lerner, Fanwood, N.J.

[73] Assignee: Lockheed Electronics Co., Inc., Plainfield, N.J.

[22] Filed: Nov. 4, 1975

[21] Appl. No.: 628,464

[52] U.S. Cl. .................... 324/51; 324/133; 324/158 D; 340/253 E

[51] Int. Cl.[2] .................... G01R 31/02

[58] Field of Search ...... 324/51, 73 R, 133, 158 D, 324/140; 307/235 P, 235 N; 328/151, 135; 340/248 A, 248 E, 253 E; 333/6, 7 D

[56] References Cited

UNITED STATES PATENTS

| | | | |
|---|---|---|---|
| 3,122,729 | 2/1964 | Bothwell et al. | 340/248 A |
| 3,581,219 | 5/1971 | Alexander | 307/235 P X |
| 3,599,096 | 8/1971 | Stemples et al. | 324/140 R |
| 3,602,826 | 8/1971 | List et al. | 328/151 |
| 3,617,879 | 11/1971 | Mugnier | 340/248 A |
| 3,621,387 | 11/1971 | Smith et al. | 324/73 R |
| 3,633,016 | 1/1972 | Walker et al. | 324/73 R X |
| 3,683,284 | 8/1972 | Mueller | 307/235 N X |
| 3,745,548 | 7/1973 | Skelton et al. | 340/253 E |
| 3,787,735 | 1/1974 | De Witte et al. | 324/73 R X |
| 3,883,801 | 5/1975 | Hess | 324/73 R |

*Primary Examiner*—Gerard R. Strecker

[57] ABSTRACT

A circuit for monitoring the accuracy of the phase shift produced in an r.f. power distribution network in which the phase shift network includes diodes, means for sensing the conductive state of the terminating diodes, and structure for comparing the state of the diodes against a desired condition to provide a warning indication in the event the diodes are not in the proper condition to provide the desired phase shift.

5 Claims, 2 Drawing Figures

PERFORMANCE ASSURANCE APPARATUS FOR PHASED ANTENNA ARRAY DRIVES

DISCLOSURE OF INVENTION

The present invention relates generally to r.f. power distribution networks, and more particularly to a system for monitoring the accuracy of the phase-shifting portion of the network.

An r.f. power distribution network is employed, for example, to apply r.f. power to the radiating elements of a phased array antenna. For the antenna array to radiate a desired radiation pattern or beam, the r.f. power coupled to each of the radiating elements in the array must be in accordance with a predetermined phase and amplitude relationship such that each element produces a radiation pattern that enables the complete antenna array to produce a desired radiation pattern.

In one type of power distribution network for supplying r.f. power to the radiating elements in a phased array, such as that shown in U.S. Pat. No. 3,728,648, a portion of an input r.f. signal is passed through a digital-type phase shifter which includes a number of diode-terminated 3-db couplers and loaded lines. The terminating diodes, which may advantageously be of the p-i-n type, are provided in each stage of the phase shifter and are selectively either forward or reverse biased to selectively establish each stage of the phase shifter in the proper status to achieve the desired phase shift.

In order for the antenna radiation to be of the desired pattern and direction, it is essential that the r.f. input signal be properly phase shifted; that is, it is essential that each of the terminating diodes in the phase shifter be in the correct, to wit, conducting or nonconducting, state.

It is the object of the present invention to provide a system for accurately monitoring the accuracy of the operation of the phase shifter, and to provide a warning signal whenever an improper condition of the phase shifter is monitored.

In accordance with the invention, means are provided to sense the condition, conductive or nonconductive, of the diodes in each stage of the phase shifter, and to produce a corresponding first binary signal that is compared to a second binary signal that corresponds to the desired state of the diodes required to establish the desired phase shift. If the comparison reveals an improper diode operation, an appropriate warning indicator is actuated.

To the accomplishment of the above and other objects as may hereinafter appear, the present invention relates to a phase shifter monitoring system as defined in the appended claims and as described in the appended specification taken in conjunction with the accompanying drawing, in which:

Figure 1:
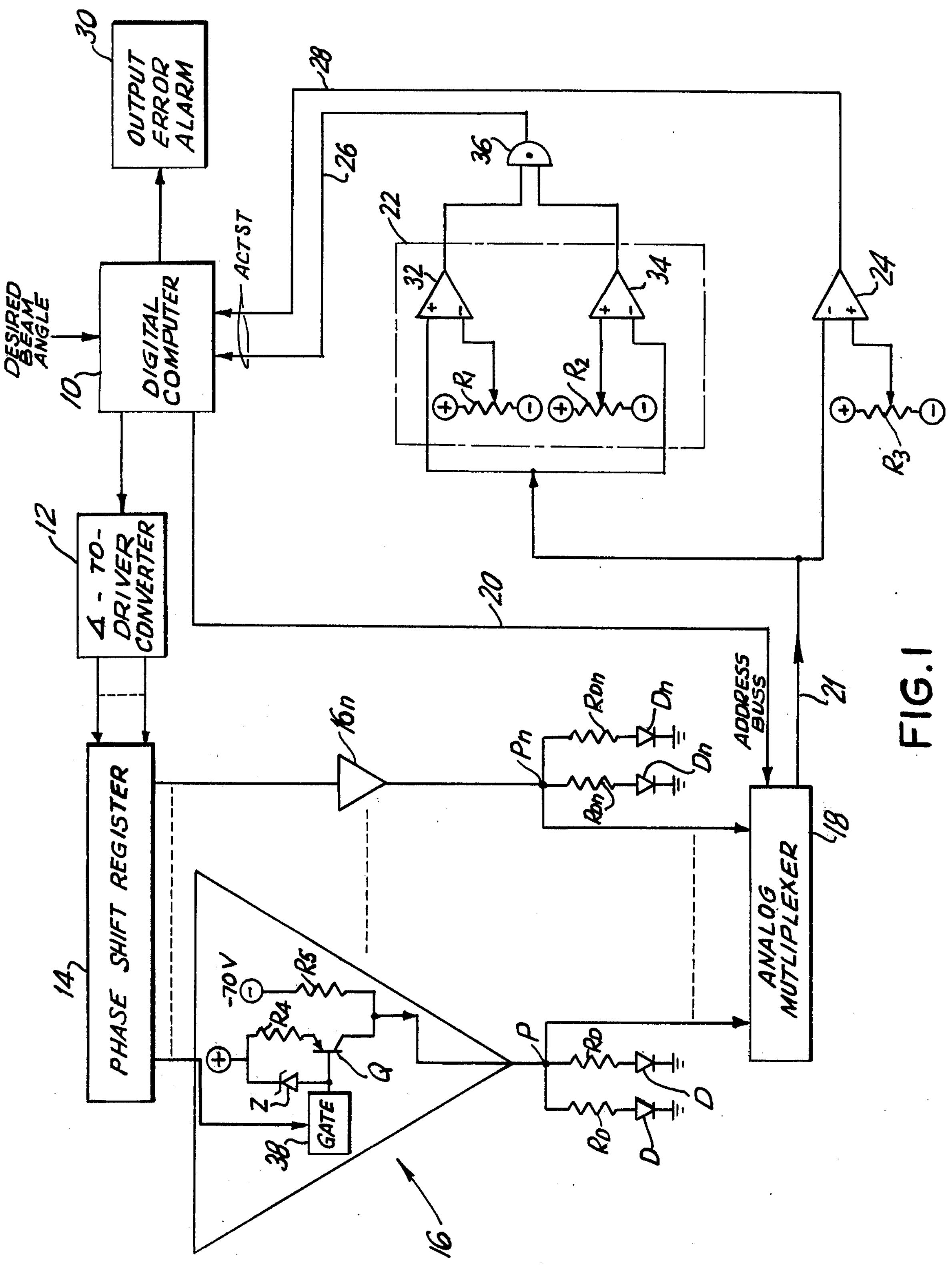
FIG. 1 is a schematic diagram of the monitoring system of the invention.

The monitoring system of the invention, as in the embodiment thereof shown in FIG. 1, operates in conjunction with a digital computer, or comparable data processer, 10. In the embodiment shown, the computer receives a desired beam angle input corresponding to the angle of the beam to be produced by a phased array antenna in which the beam angle is achieved by producing a predetermined phase shift in an input r.f. signal, thereby to achieve the desired power distribution to the antenna radiating elements. The desired phase shift, as described above, is achieved by selectively placing a series of terminating diodes in either a forward-or reverse-biased condition. The monitoring system of the invention, along with the computer, provides an indication whenever the bias state of the phase-shift or diodes does not correspond to the states required to achieve the desired phase shift.

To this end, computer 10 produces a binary angle signal, which if required to convert the angle data into serial binary form, is applied to the input of a combinational circuit or angle-to-driver converter 12 which performs this function and applies the binary angle signal to an n-bit phase-shift register 14. Each stage of register 14 has associated therewith a constant-current driver circuit 16, shown in FIG. 1 for the first and nth stages of the register. Each driver circuit applies a biasing signal, corresponding to the level of the binary signal applied to the associated stage of register 14, to a pair of p-i-n diodes D respectively connected to the output of each of the drive circuits $16_1$–$16n$, D to place these diodes in either a forward or reverse biased state.

Depending on the bias condition of the diodes D, a voltage at one level, e.g. + 0.7v, is established at a diode connection P if the diodes ar biased on, or at a second level, e.g. — 70v, if the diodes are biased off.

Diode connections $P_1$–$P_n$ are connected to the inputs of an analog multiplexer 18 which may be in the form of a rotary multi-contact switch or the like, which also receives an address command from the computer on a buss 20. In accordance with the address command, the voltage at each of connections $P_1$–$P_n$ is sequentially sensed and applied to an output line 21, which is connected to the inputs of a window comparator 22 and a second comparator 24. As described in greater detail below, comparator 22 develops a logic 1 signal on a line 26 only when the sensed voltage level at the connection P is at the "on" or 0.7v level, and comparator 24 develops a logic 1 signal on a line 28 only when the voltage at the connection P being addressed is at the "off" or −70v level.

Figure 2:
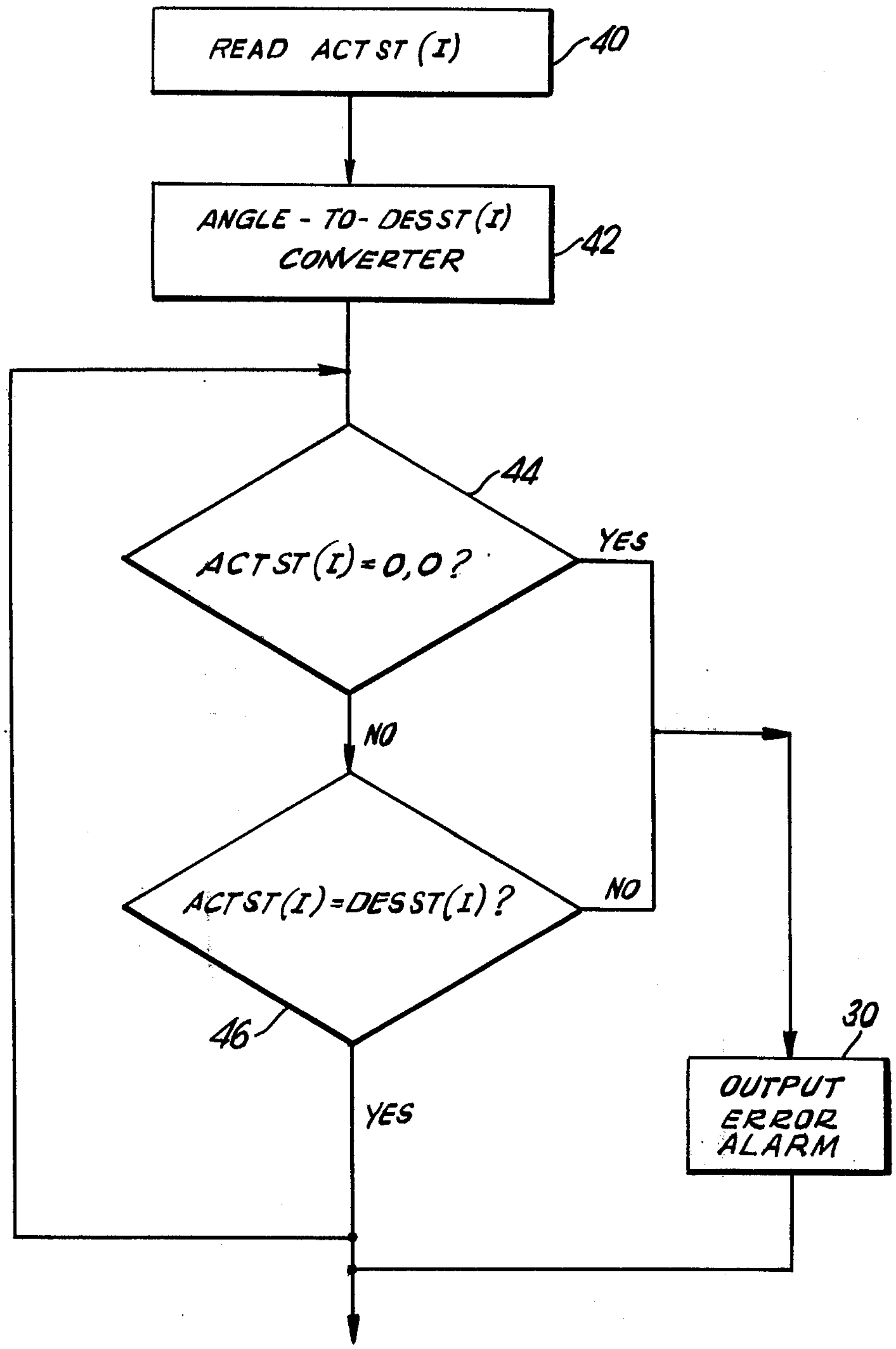
FIG. 2 is a flow chart illustrating a program for use in the computer portion of the system.

Lines 26 and 28, which are thus at either the 0 or 1 logic level depending on the sensed diode voltage level, carry a two-bit binary signal corresponding to the sensed conductive state of the phase-shift diodes D. This two-bit signal is applied to the computer 10 which, as explained in greater detail below with respect to FIG. 2, compares the binary diode-state signal with an internally generated binary signal corresponding to the desired diode biasing condition necessary to bring about the desired phase shift and beam angle. Should the computer comparison indicate a lack of correlation between the desired and actual diode condition, a warning signal is generated and employed to actuate an error indicator 30 to inform the system operator that an improper phase shift and a correspondingly improper beam angle is being produced.

As shown in FIG. 1, window comparator 22 includes a first operational amplifier 32 and a second operational amplifier 34, the outputs of which are coupled to the inputs of and AND gate 36, the output of which is a binary signal appearing at line 26. The diode state voltage signal from multiplexer 18 is applied to the plus input of amplififer 32 and to the minus input of amplifier 34. Reference voltage signals derived from resistors R1 and R2 are respectively applied to the minus and plus inputs of amplifiers 32 and 34. The output of multiplexer 18 is also applied to the minus input of the operational amplifier which constitutes comparator 24 and a reference signal obtained from a resistor R3 is applied to the plus input of this amplifier.

Each pair of terminating diodes D is connected to connection P through resistors $R_D$ and to ground. As shown in FIG. 1, drive circuits 16 may include a gate 38 having an input connected to the appropriate stage of shift register 14, and an output connected to the base of a transistor Q. The base of the transistor is also connected to a voltage source through a Zener diode Z. The emitter of the transistor is connected through a resistor $R_4$ to a voltage source, and the collector is connected through a resistor $R_5$ to a −70v source and to the diode pair and its associated voltage-monitoring connection P.

FIG. 2 illustrates in flow chart from a program that may be employed in the computer to make the comparison between the actual beam data as indicated by the sensed bias condition of the phase-shifting diodes, and the desired beam angle. As therein shown, the first instruction to the computer at 40 is to read the actual beam data or status (ACTST) for each diode pair of phase-shift bit. The next step shown at 42 is the conversion of the desired beam angle to corresponding binary form (DESST) so that the comparison can be made.

As shown at 44, an initial comparison is made to see if the ACT ST signal on lines 26, 28 is 0,0 which would indicate that the diodes for the shift register stage being monitored are neither on nor off; a fault condition. If this comparison produces an affirmative result, an error signal is applied to the error signal indicator 30. If the result of this comparison is negative, a further comparison is made, as shown at 46, to determine if the actual beam binary data (ACTST) correlates with the desired beam binary data (DESST). If the answer is negative, an improper phase-shift condition is indicated and an error signal is applied to error indicator 30. If the comparison is made, the monitored phase-shift condition is proper and the test is continued for the succeeding pair of phase-shift diodes.

It will be appreciated from the foregoing description of one specifically described embodiment, that the system of the invention provides efficient, reliable and continuous monitoring of the actual beam angle of a phased array antenna by monitoring the bias condition of the phase-shift diodes in the antenna power distribution network.

Although in the embodiment described the two voltage levels produced for the on and off condition are 0.7v and −70v, it will be understood that other voltage levels may be employed for this purpose. For example, to make the circuit amenable for implementation in an integrated circuit, a lower voltage may be developed for the off condition by the use, for example, of a voltage reduction potentiometer placed intermediate the diodes and the multiplexer.

It will thus be appreciated that although only a single embodiment of the invention has been hereinabove specifically described, modifications to this embodiment may be made without necessarily departing from the spirit and scope of the invention.

What is claimed is:

1. In an r.f. phase shift system including a plurality of diodes, digital phase shift specifying means for supplying a binary signal specifying bias states for said diodes, and means for selectively biasing said diodes to operate in one of a conducting and a nonconducting state to bring about a predetermined r.f. phase shift in response to the phase shift dictated by said phase shift specifying means, each of said diodes exhibiting characteristic first and second potentials when biased to said conducting and nonconducting states, a monitoring circuit for determining whether said diodes are properly biased to bring about said predetermined phase shift, said monitoring circuit comprising means coupled to each of said diodes for sensing the bias state indicating characteristic potential there across, means coupled to said sensing means for producing a diode bias state indicating first additional binary signal corresponding to said obtaining characteristic potential, means coupled to said first additional binary signal producing means and to said phase shift specifying means for comparing said first additional binary signal with said binary signal corresponding to the desired bias condition at said diodes to achieve a predetermined phase shift, and indicating means connected to said comparing means to provide a warning indication upon the sensing of a lack of correspondence between said binary signal and said first additional binary signal.

2. The monitoring circuit of claim 1, in which said first additional binary signal producing means comprises a first comparator for comparing the output of said sensing means coupled thereto against a first reference to produce a first bit signal at one level only upon the sensing of said first characteristic potential at said diodes, and a second comparator for comparing the output of said sensing means coupled thereto with a second reference and for producing a second bit signal at said one level only upon the sensing of said second characteristic potential at said diodes, said first and second bit signals constituting said first additional binary signal.

3. The monitoring circuit of claim 2, wherein said diode biasing means comprises a plurality of drive circuits respectively connected to one side of said plurality of diodes at a plurality of sensing points, each of said drive circuits receiving a bias signal for its associated of said diodes and being effective to establish said one of said characteristic potentials at said sensing points.

4. The monitoring system of claim 2, further comprising means connected to said sensing means for sequentially applying said diode voltages from said sensing means to said first and second comparators.

5. The monitoring circuit of claim 4, in which said first comparator includes first and second operational amplifiers each having a positive and a negative input, said sequentially applied diode voltages being applied to the positive and negative inputs of said first and second amplifiers respectively, first and second preset references voltage sources respectively connected to the negative and positive inputs of said first and second amplifier, and an AND gate connected to the outputs of said first and second amplifiers, the output of said AND gate constituting said first bit signal.

* * * * *